US011355790B2

(12) United States Patent
Lysfjord et al.

(10) Patent No.: US 11,355,790 B2
(45) Date of Patent: Jun. 7, 2022

(54) ENERGY STORAGE MODULE

(71) Applicant: Siemens Energy AS, Oslo (NO)

(72) Inventors: Ivar Haakon Lysfjord, Inderoey (NO);
Geirfinn Sirnes, Tronheim (NO);
Steinar Skaga, Trondheim (NO);
Gunnar Snilsberg, Heimdal (NO)

(73) Assignee: Siemens Energy AS, Oslo (NO)

( * ) Notice: Subject to any disclaimer, the term of this patent is extended or adjusted under 35 U.S.C. 154(b) by 0 days.

(21) Appl. No.: 17/049,229

(22) PCT Filed: May 21, 2019

(86) PCT No.: PCT/EP2019/063148
§ 371 (c)(1),
(2) Date: Oct. 20, 2020

(87) PCT Pub. No.: WO2019/224213
PCT Pub. Date: Nov. 28, 2019

(65) Prior Publication Data
US 2021/0367276 A1   Nov. 25, 2021

(30) Foreign Application Priority Data

May 22, 2018  (GB) ..................... 1808368

(51) Int. Cl.
*H01M 10/42*  (2006.01)
*H01M 50/51*  (2021.01)
(Continued)

(52) U.S. Cl.
CPC ..... *H01M 10/425* (2013.01); *H01M 10/4207* (2013.01); *H01M 50/284* (2021.01);
(Continued)

(58) Field of Classification Search
CPC .................................................. H01M 10/425
See application file for complete search history.

(56) References Cited

U.S. PATENT DOCUMENTS

2010/0271223 A1* 10/2010 Ohkura ............... H01M 10/425
340/636.13
2012/0148876 A1   6/2012 Zeng et al.
(Continued)

FOREIGN PATENT DOCUMENTS

JP   2013004185 A   1/2013
JP   2015106536 A   6/2015
(Continued)

OTHER PUBLICATIONS

PCT International Search Report and Written Opinion of International Searching Authority dated Aug. 2, 2019 corresponding to PCT International Application No. PCT/EP2019/063148 filed May 21, 2019.

*Primary Examiner* — Brian R Ohara
(74) *Attorney, Agent, or Firm* — Wolter Van Dyke Davis, PLLC

(57) ABSTRACT

An energy storage module includes a plurality of energy storage devices electrically connected together in series; and a plurality of electronics boards distributed across the module, in electrical contact with one or more of the energy storage devices. The module further includes a plurality of flexible printed circuit boards whereby each of the plurality of electronics boards are electrically connected together in series with a neighboring one of the plurality of electronics boards by a different one of the flexible printed circuit boards. For each electronics board and for each flexible printed circuit board, a ground plane is provided, whereby the ground planes provide electrical grounding at substantially the same potential across all the electronics boards and all the flexible printed circuit boards.

9 Claims, 5 Drawing Sheets

(51) Int. Cl.
    *H01M 50/284*     (2021.01)
    *H01K 1/02*     (2006.01)
    *H01K 1/14*     (2006.01)
    *H05K 1/02*     (2006.01)
    *H05K 1/14*     (2006.01)

(52) U.S. Cl.
    CPC .......... *H01M 50/51* (2021.01); *H05K 1/0277* (2013.01); *H05K 1/14* (2013.01); *H01M 2010/4271* (2013.01); *H01M 2220/20* (2013.01); *H05K 2201/10037* (2013.01)

(56) References Cited

U.S. PATENT DOCUMENTS

2018/0047958 A1    2/2018    Sato et al.
2018/0090952 A1*   3/2018    Ota .................... H01M 10/425

FOREIGN PATENT DOCUMENTS

WO    2012011237 A1    1/2012
WO    2018124494 A2    7/2018

\* cited by examiner

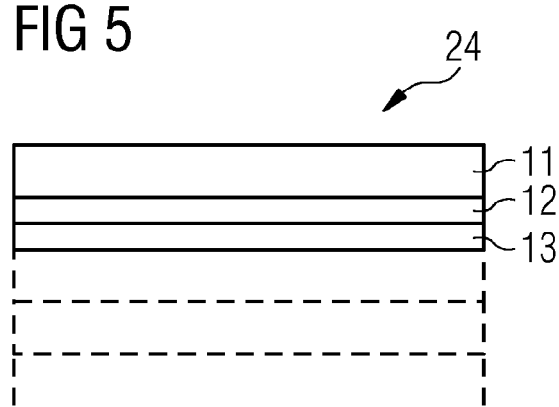
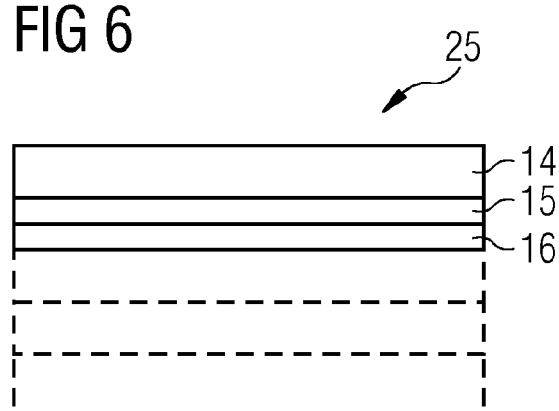

ENERGY STORAGE MODULE

CROSS REFERENCE TO RELATED APPLICATIONS

This application is the US National Stage of International Application No. PCT/EP2019/063148 filed 21 May 2019, and claims the benefit thereof. The International Application claims the benefit of United Kingdom Application No. GB 1808368.3 filed 22 May 2018. All of the applications are incorporated by reference herein in their entirety.

FIELD OF INVENTION

This invention relates to an energy storage module, in particular a module comprising electrochemical cells, or batteries, providing electrical energy to an end user.

BACKGROUND OF INVENTION

Stored electrical energy modules, or power units of various types are becoming increasingly common in many applications, in particular for use where there are environmental concerns relating to emissions in sensitive environments, or public health concerns. Stored electrical energy power units are typically used to provide electrical energy to operate equipment, to avoid emissions at the point of use, although that stored energy may have been generated in many different ways. Stored electrical energy may also be used to provide peak shaving in systems otherwise supplied from the grid, or from various types of power generation system, including diesel generators, gas turbines, or renewable energy sources. Aircraft, vehicles, vessels, offshore rigs, or rigs and other powered equipment in remote locations are examples of users of large scale stored electrical energy. Vehicle drivers may use the stored energy power unit in city centres and charge from an internal combustion engine on trunk roads, to reduce the harmful emissions in the towns and cities, or they may charge up from an electricity supply. Ferries which carry out most of their voyage relatively close to inhabited areas, or in sensitive environments are being designed with hybrid, or fully electric drive systems. Ferries may operate with stored energy to power the vessel when close to shore, using diesel generators offshore to recharge the batteries. In some countries the availability of electricity from renewable energy sources to use to charge the stored energy unit means that a fully electric vessel may be used, provided that the stored energy units are sufficiently reliable for the distances being covered, with no diesel, or other non-renewable energy source used at all. Whether hybrid, or fully electric, the stored energy units may be charged from a shore supply when docked. The development of technology to achieve stored energy units that are reliable enough for prolonged use as the primary power source must address certain technical issues.

SUMMARY OF INVENTION

In accordance with a first aspect of the present invention, an energy storage module comprises a plurality of energy storage devices electrically connected together in series; and a plurality of electronics boards distributed across the module, in electrical contact with one or more of the energy storage devices; the module further comprising a plurality of flexible printed circuit boards whereby each of the plurality of electronics boards are electrically connected together in series with a neighbouring one of the plurality of electronics boards by a different one of the plurality of flexible printed circuit boards; and for each electronics board and for each flexible printed circuit board, a ground plane is provided, whereby the ground planes provide electrical grounding at substantially the same potential across all the electronics boards and all the flexible printed circuit boards.

A grounding shield in a flexible printed circuit board extends the whole ground plane of the electronics boards to form a common low impedance ground plane for the energy storage module, even in situations where the geometry of the module makes it difficult to use a single electronics board and ground plane. The ground planes also provide shielding for the signal wires.

The electronics boards may also comprise flexible printed circuit boards, but too much flexibility may make connections and assembly more difficult, so typically, the electronics boards comprise printed circuit boards, which are more rigid.

Advantageously, the flexible printed circuit boards between each electronics board comprise flexible printed circuit cables.

Advantageously, the module further comprises communication links on the flexible printed circuit boards between electronics boards for communicating data collected on each electronics board to a controller.

The common low impedance ground plane of the energy storage module provides shielding from electrical noise for signals sent on the communication links.

Advantageously, the ground plane of the flexible printed circuit board comprises at least one ground layer for shielding communication links and for providing the ground for the electronics board, or for extending the ground from each electronics board; and at least one signal layer.

The ground layer is typically a pure ground layer, although a mixed ground and signal layer may be used, depending on the application. However, a mixed layer needs a substantial ground component, so in that case it is advantageous that the ground element is at least two thirds of the mixed layer, in particular, between 70% and 90% of the mixed layer.

Advantageously, the signal layer comprises one of a pure signal layer, or a mixed ground and signal layer.

The series connected flexible printed circuit boards and electronics boards may form a continuous loop around the energy storage modules.

Whether or not the series connected flexible printed circuit boards and electronics boards form a continuous loop depends upon the application.

BRIEF DESCRIPTION OF THE DRAWINGS

An example of an energy storage module according to the present invention will now be described with reference to the accompany drawings in which:

FIG. 5 shows more detail of the structure of an electronics board for use in the embodiments of FIGS. 3a and 3b or FIGS. 4a and 4b;

FIG. 6 shows more detail of the structure of a flexible printed circuit board for use in the embodiments of FIGS. 3a and 3b or FIGS. 4a and 4b; and, FIG. 7 illustrates part of the energy storage module according to the present invention from above.

DETAILED DESCRIPTION OF INVENTION

Early large scale batteries were lead acid, but more recently, lithium ion batteries have been developed for electrical energy storage for large scale applications. Li-ion batteries are typically pressurised and the electrolyte is flammable, so they require care in use and storage. A problem which may occur with Li-ion batteries is thermal runaway which may be caused by an internal short circuit in a battery cell, created during manufacture. Other causes, such as mechanical damage, overcharge, or uncontrolled current may also cause thermal runaway, but the battery system design is typically adapted to avoid these. Manufacturing issues with the cells cannot be ruled out entirely, so precautions are required to minimise the effect should thermal runaway occur. In a large scale Li-ion battery system, the amount of energy that is released during a thermal runaway is a challenge to contain. A thermal event may increase temperatures in a single cell from a standard operating temperature in the range of 20° C. to 26° C. to as much as 700° C. to 1000° C. Safe operating temperatures are below 60° C., so this is a significant problem.

There are strict regulations in the marine and offshore industries regarding risk to the vessel or rig, one requirement being that there should be no transfer of excess temperature from one cell to another. If overheating occurs, then it should be contained in a single cell and not allowed to spread. In addition, for marine and offshore applications, weight and volume of any equipment is severely restricted, leading to compact, lightweight systems being advantageous. It is a challenge to produce a compact, lightweight, system that achieves the required thermal isolation and cools the cell in which excess heating occurs, quickly and efficiently.

In a Li-ion battery system, it is very important that the temperature of the battery cells does not exceed the prescribed operating temperature and that the cell temperature in the entire system is uniform. Sustained operation outside the prescribed operating temperature window may severely affect the lifetime of the battery cells and increases the risk of thermal runaway occurring.

For marine applications, there is a particular focus on using energy storage modules, such as batteries, at their maximum charge or discharge rate due to cost of installation and the weight and space taken up by the modules when on a vessel or offshore platform. Furthermore, maintenance and repair, or replacement is complicated and expensive compared to land based uses of stored energy systems, so extending the lifespan of stored energy modules is particularly important. For the example of Li-ion batteries, these are sensitive to high temperature, so it is important to ensure that the operating and ambient temperature are controlled for all cells of a Li-ion battery system to ensure the design lifetime is met. Local variations or hot spots on a single cell may also compromise the total lifetime achievable.

Figure 1:
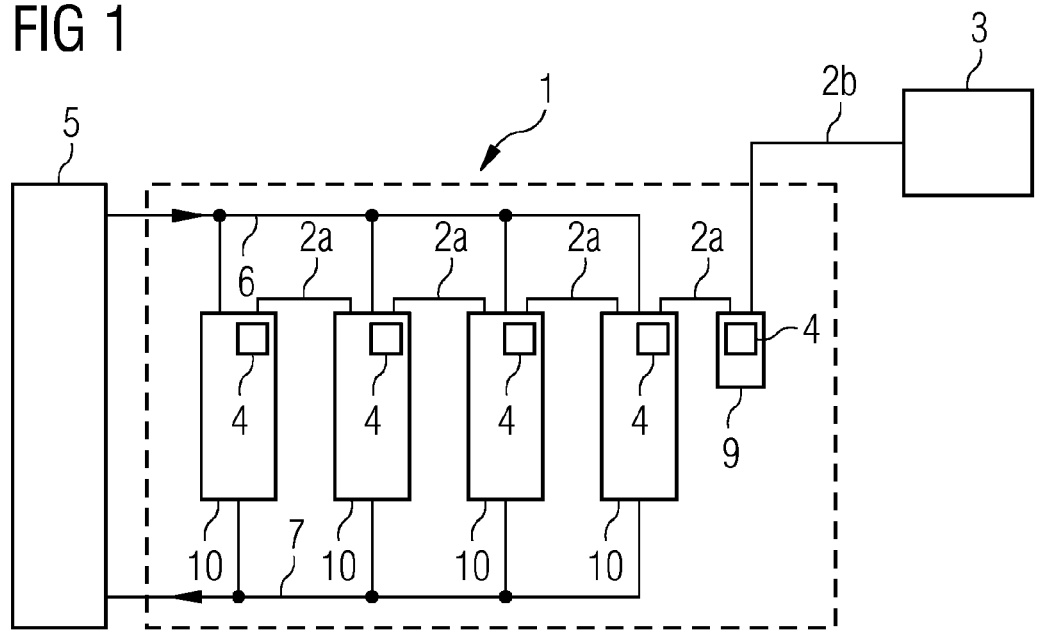
FIG. 1 is a block diagram illustrating an energy storage system in which the energy storage module of the present invention may be used.

Energy storage modules comprising a plurality of energy storage devices, for example batteries, or cells, may be combined in an energy storage unit. An example of an energy storage system in which the present invention may be applied is illustrated in FIG. 1. The system comprises a cabinet, cubicle, or unit 1, in which a plurality of energy storage modules 10 are electrically connected together by buses 2a to a cubicle controller 9 and by bus 2b to a central controller 3. Wireless communication 4 may be provided between the modules and the cubicle controller 9. Energy storage modules 10 within a cubicle 1 may be electrically connected in series, as shown, or in parallel, or a combination, such as some modules being connected in parallel and then that parallel grouping being connected in series with other modules in the unit. Each of the energy storage modules 10 is cooled by cooling fluid, circulating from cooling system 5 through inlet pipes 6 and outlet pipes 7. The cooling fluid is typically water which is inexpensive and easier to source and dispose of than synthetic coolants. Additives may be provided, for example to inhibit freezing, biogrowth, or corrosion. Typically the proportion of additive is determined by the additive chosen, for example 20% frost inhibitor. The cooling fluid is typically supplied to each module in parallel, although it is possible, but less effective for the later modules, to supply the cooling fluid in series. Each energy storage module 10 comprises a plurality of energy storage devices, for example battery cells, electrically connected together in series. A modular system of this type, incorporating cooling, is particularly applicable for Li-ion cells.

Figure 2:
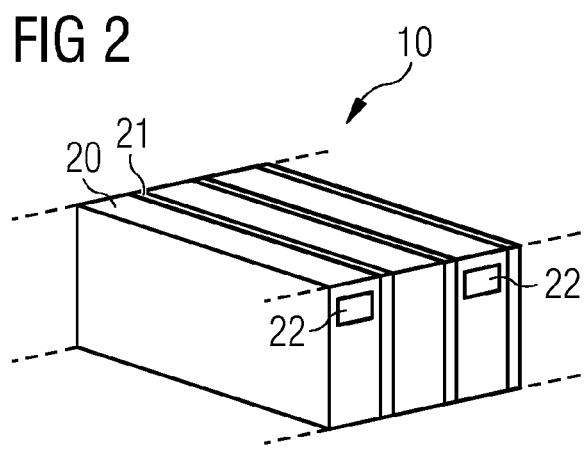
FIG. 2 illustrates a part of an energy storage module according to the present invention, in more detail.

Within a module 10 in which a plurality of energy storage devices 20 (see FIG. 2), such as battery cells are electrically connected together in series, a battery cell cooler 21 may be provided on at least one side of each cell and cooling fluid may be provided from the cooling system 5 via the inlet pipes 6 and outlet pipes 7 to cool the battery cell. The cell cooler 21 comprises tubing for the cooling fluid to flow through, which may be metal tubing, but more typically is a synthetic material, such as polymer plastics, for example polythene, polyamide, such as PA66 plastics, or thermoplastics such as TCE2, TCE5, or other suitable materials, which may be moulded or extruded to the required shape, or generated by additive manufacturing techniques and is able to withstand normal operating temperatures of the energy storage modules 10. Individual energy storage devices 20 may be stacked on one another, as illustrated on its side in FIG. 2, with or without additional layers (not shown), between the side of the cell away from its cooler 21 and the surface of the next cooler in the stack, for example to provide additional insulation, or to provide compression of the cell. Assembly and construction of energy storage modules may be further improved.

Energy storage modules may comprise a large number of cells 20 per module 10, each of which may be connected to electronic circuitry on an electronics board 24, 26, for example, for monitoring and control purposes, by tabs 22 that have an exposed surface area outside the cell, as illustrated in the examples of FIGS. 3a and 3b and 4a and 4b. The larger the number of cells, the greater the total exposed area of the battery tabs. In a high volume product, the connection from the battery cell tabs to a battery management system is often by means of a direct connection from a printed circuit board (PCB) assembly 24, 26 to the cell tabs 22. This is because connecting individual wires to each battery cell tab 22 takes too long and so is too costly in volume production. The number of cells in a module may become so high that it is not possible to contact all of the tabs of the cells with a single printed circuit board. The total exposed tab area that needs to be covered by the PCB connection may be too large for a single PCB assembly to be used, so several PCB assemblies 24, 26 are needed in order to be able to connect to all of the cell tabs. This problem is greatest on cells that have the cell tabs 22 located on different sides of the energy storage device, rather than all on the same side. For example, pouch cells may have the cell tabs 22 on opposite sides in order to divide heat better across the area of the cell. Thus, connections and hence PCB assemblies 24, 26 are required on both sides, which may result in separate PCB assemblies being provided on either side. In the examples, PCB assemblies 24 connect to tabs on one side and PCB assemblies 26 connect with tabs on the other side of the stack of energy storage devices 20.

Although, the connection between the boards on either side may be made with wires, or connectors, there are problems with both. The wire solution gives flexibility between boards, especially if they are not located in the same geometric plane. The connector solution gives less area without ground plane, but may lead to difficulties in assembly when the boards are not in the same geometrical plane, and may also cause mechanical problems, due to the stiffness of the board and connectors. However, wires between the boards are more exposed to noise than the boards themselves, because the wires are not shielded. Furthermore, even with direct connectors between the boards, there is no low impedance ground reference plane for all the different boards, as a result of which there may be voltage differences between the boards, both DC and AC, which may lead to errors in data obtained about, or errors in operation of, the cells of the module.

To reduce, or remove, the effects of these problems the boards may be connected together with flexible printed circuit cables (FPC) with a ground plane, or by forming all the boards and their connections from FPCs with a ground plane. FPCs provide essentially the same functionality as a PCB, but are flexible. The FPCs with a ground plane also act as a ground extension on boards in the battery module, so that there is a common low impedance ground for all the energy storage devices. The design provides RF immunity from external electrical noise, for the electronics boards by providing a continuous low impendence ground plane.

Figure 3A:
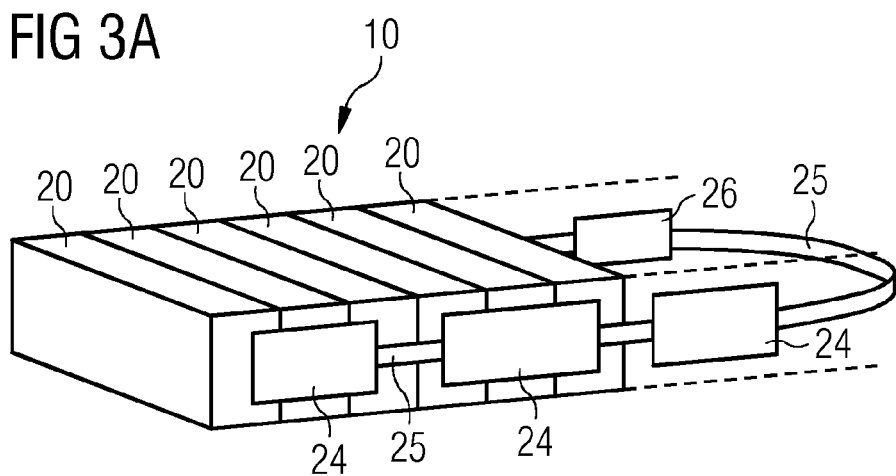
FIGS. 3a and 3b illustrate another view of a part of an energy storage module according to one embodiment of the present invention.
Figure 3B:
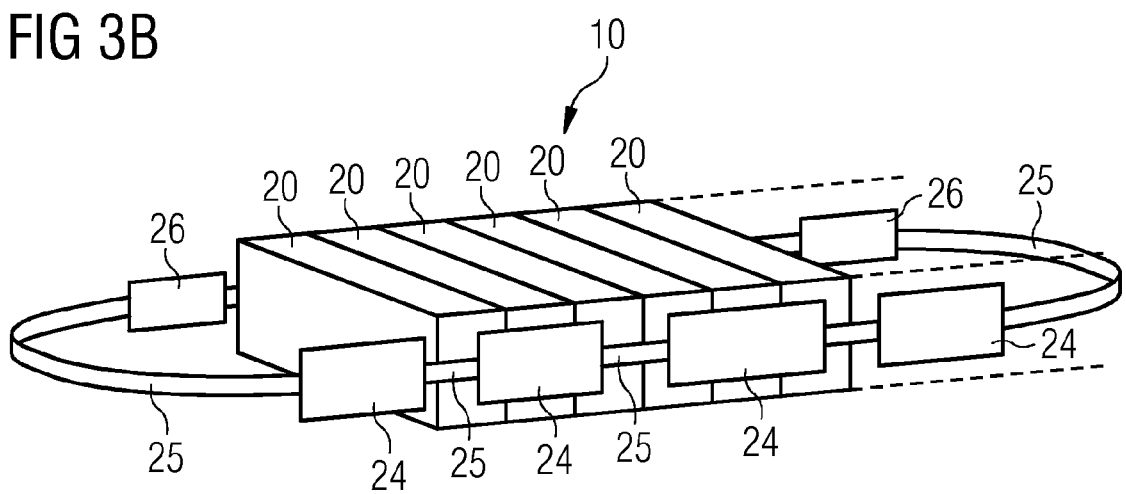

FIGS. 3*a* and 3*b* illustrate different arrangements of a first example of the present invention, in which an energy storage module 10 comprising a plurality of energy storage devices 20 is shown. The coolers, although part of the module, are omitted from FIGS. 3*a* and 3*b* and FIGS. 4*a* and 4*b*, for clarity. The module 10 comprises a plurality of electronics boards 24, 26 in contact with exposed areas of tabs 22 on one side or the other of the energy storage devices. Each of the electronic boards comprise multilayer boards, having several layers of conducting copper striplines 11, forming signal wires, and a ground plane layer 13, separated by insulating materials 12. Each electronic board may comprise multiple sets of stripline signal wire layers 11, ground plane layers 13, and separating insulating layers 12, but for convenience only one set is shown in FIG. 5. The ground plane layers are substantially covered in a suitable conductive metal, typically copper, although a ground plane may also comprise a limited mixture of ground and signal lines. For example, a ground plane comprising two thirds or more ground, for example 90% ground and 10% signal lines, or 85% ground and 15% signal lines, or 70% ground and 30% signal lines would still have beneficial effects in certain applications.

Figure 4A:
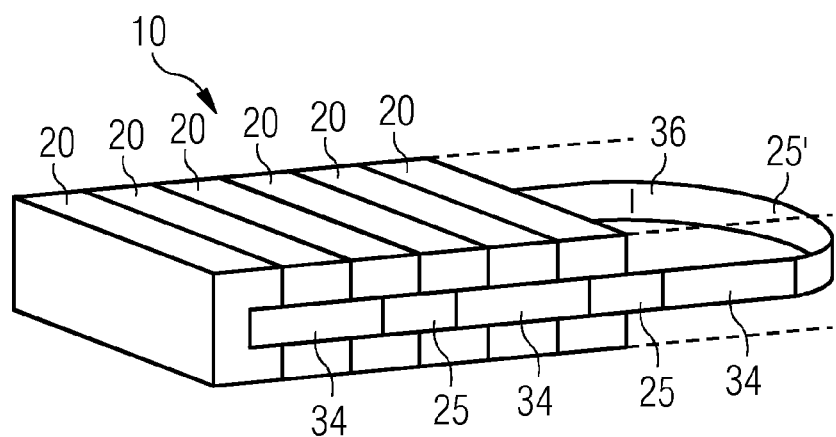
FIGS. 4a and 4b illustrates another view of a part of an energy storage module according to another embodiment of the present invention.
Figure 4B:
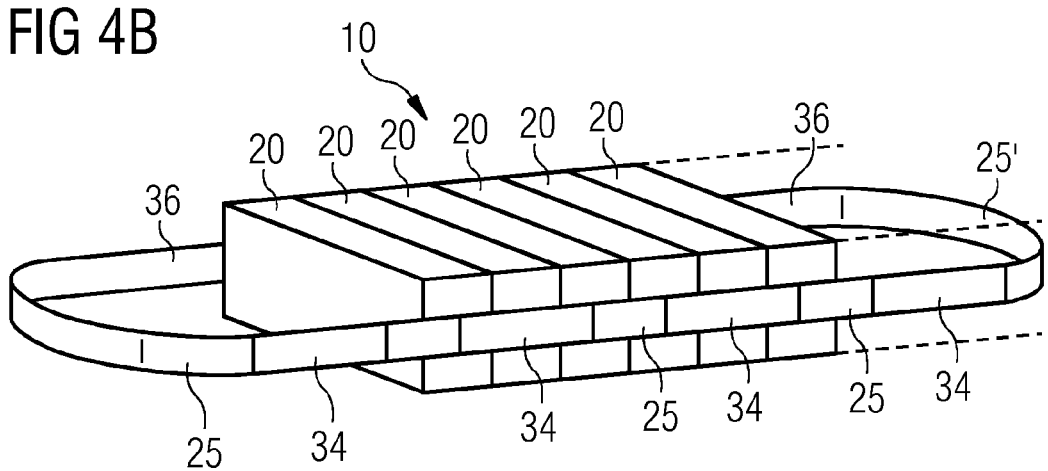

The electronics boards 24, 26 are electrically connected together by flexible printed circuit boards, for example flexible printed circuit cables 25 between the boards, the FPCs as shown in FIG. 6, having a flexible printed circuit layer 14, an insulating layer 15 and at least one ground reference plane 16, which provides a low impedance ground plane between the electronics boards. This means that electronics boards 24, 26 can be connected together with a low impedance connection 25, suitable for the particular application and as this connection is flexible, the connection can be made between boards 24, 26 in different geometrical planes. Additionally, any signal wires that are routed through one of the FPCs 25 are protected against noise by the FPC ground plane 16, in the same way that the ground plane 13 of the PCB or PCB assembly would protect those signal wires from noise. Each of the flexible printed circuit boards may comprise multiple sets of multilayer flexible boards, but for convenience only one set is shown in FIG. 6. In addition, there may be a control board (not shown) if space on the electronics boards is limited, connected between board 24 and board 26 on the end by FPCs from the adjacent electronics boards 24, 26. The signal wires and ground planes in the FPCs may be arranged to go through this control board, with some of the signal connections to the control board. FIGS. 4*a* and 4*b* illustrate a second example of the present invention, in which an energy storage module 10 comprising a plurality of energy storage devices 20 is shown.

The module comprises a plurality of electronics boards 34, 36 in contact with exposed areas of tabs 22 of the energy storage devices, but in place of the printed circuit board 24 for the electronics boards, this example uses a flexible printed circuit cable 25 with a ground plane 16 for the electronics boards, i.e. having the same layer construction as illustrated in FIG. 6. In general, the use of the more rigid PCBs as illustrated in FIGS. 3*a* and 3*b* is advantageous because they are less expensive than flexible PCBs and too much flexibility may make it more difficult to ensure a good connection to the tabs, or otherwise complicate the assembly. However, there may be situations, such as a particularly non-uniform cell arrangement in the modules, which make flexible PCBs attractive. As before, these electronics boards are then electrically connected together by flexible printed circuit cables 25 between the boards, the FPCs having at least one ground reference plane 16, which provides a low impedance ground plane between the electronics boards 34. This embodiment provides boards with mechanical flexibility, as well as the connections between them mechanically flexible, so that the connection can be made between boards in different geometrical planes and with any shape of cells. As in the previous example, the ground planes of the electronics boards 34, 36 provide the common low impedance connection. Signal wires that are routed through any of the FPCs, whether the electronics board 34, 36, or the connections 25, are protected against noise by the FPC ground plane 16.

In the examples of both FIGS. 3*a* and 3*b* and FIGS. 4*a* and 4*b*, the flexible printed circuit boards may be formed as a multi-layer signal and ground, where each ground plane layer performs as an electrical shield and a low impedance connection to ensure that all signals have the same ground potential. In the example of FIGS. 3*a* and 4*a*, the flexible printed circuit board 25 and electronics boards 24, 26 do not form a continuous loop, but may have a gap in the connections at one end. Alternatively, if the construction of the energy storage module requires it, the flexible printed circuit board 25 and electronics boards 24, 26 may form a continuous loop, as shown in FIGS. 3*b* and 4*b*. Some energy storage devices have been omitted for clarity in FIGS. 3*b* and 4*b* and in practice, the flexible printed circuit board at the end of a stack of energy storage devices may be held in close contact with them.

Figure 7:
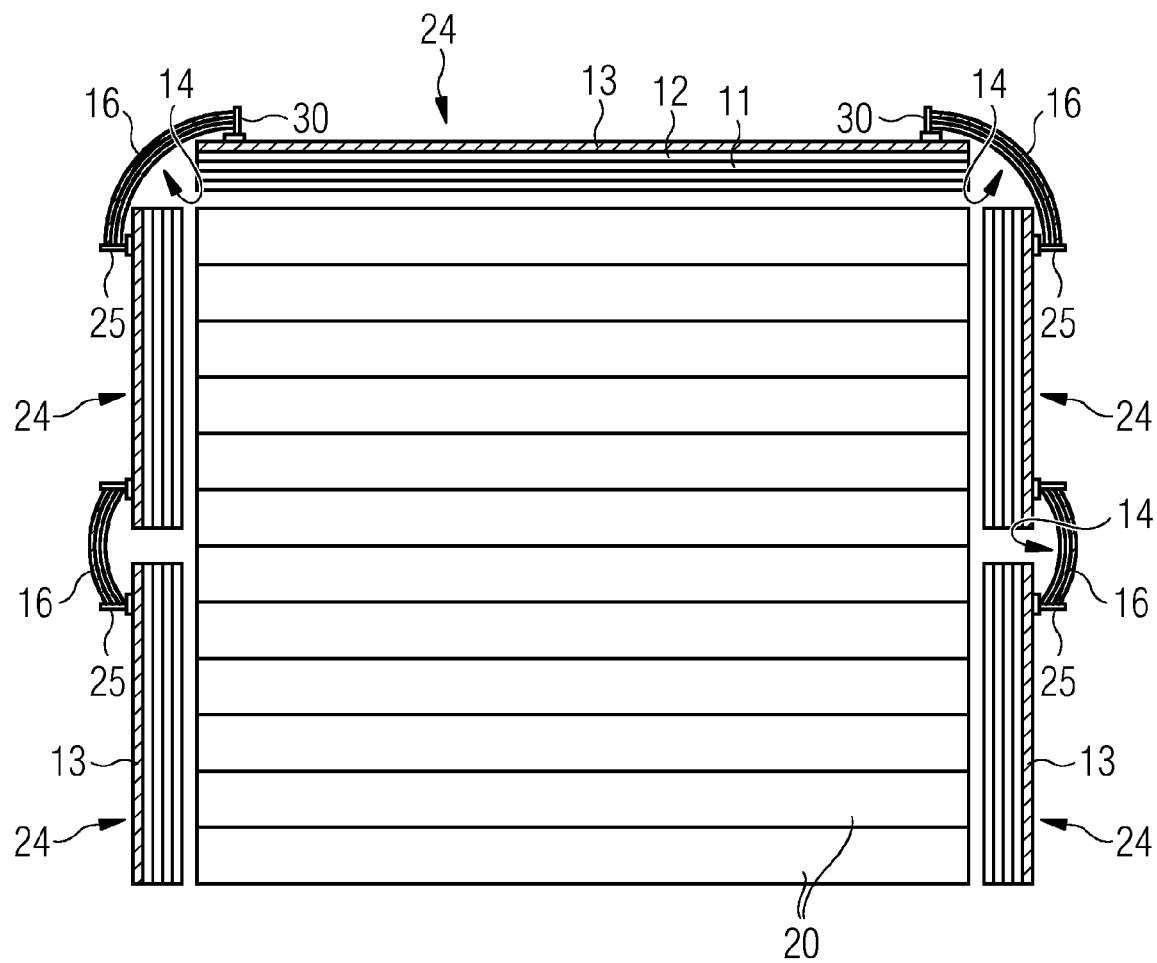

FIG. 7 illustrates part of the energy storage module from above, showing the end to end nature of the ground layer formed by the combination of rigid and flexible printed circuit boards and their ground layers. Details of the electrical contact between the energy storage devices and the electronics boards are omitted for clarity. Each flexible printed circuit board 25 is mounted at its ends 30 in contact with the ground layer 13 of each rigid printed circuit board 24 that it joins together. Thus, the ground layers of the flexible and rigid printed circuit boards together provide electrical grounding at substantially the same potential across all the electronics boards and all the flexible printed circuit boards.

These and other embodiments of the invention as claimed improve performance with respect to using wire or direct connections between the electronics boards, because the signal wires are more protected against noise and the ground reference plane is low impedance across the boards, giving a more robust system, protected from noise. The PCB assemblies of the energy storage module may have direct contact with the battery tabs, whatever the number of cells, or the location of the tabs on the cells. The direct contact of the PCBs with the tabs means that mounting of the energy storage devices within the energy storage module is simpler and cheaper than using wires or other types of connectors between the tabs and the PCBs. A battery module that is more robust against noise is particularly useful in industrial applications, where noise levels may be very high.

Although the detailed examples have been given with respect to electrochemical cells, such as batteries, for example Li-ion, alkaline, or NiMh batteries, or others, the invention applies to other types of stored energy units, in particular non-cylindrical capacitors, ultracapacitors, or supercapacitors, fuel cells, or other types of energy storage which have a surface that can be cooled by a cooler and which may also suffer if the temperature of modules of the stored energy units regularly goes outside an advantageous operating range, reducing the overall lifetime and increasing maintenance costs.

The invention claimed is:

1. An energy storage module, comprising:
   a plurality of energy storage devices electrically connected together in series;
   a plurality of electronics boards distributed across the module, in electrical contact with one or more of the energy storage devices;
   a plurality of flexible printed circuit boards whereby each of the plurality of electronics boards is electrically connected together in series with a neighboring one of the plurality of electronics boards by a different one of the plurality of flexible printed circuit boards; and
   for each electronics board and for each flexible printed circuit board, a ground plane is provided, whereby the ground planes provide electrical grounding at substantially the same potential across all the electronics boards and all the flexible printed circuit boards.

2. The module according to claim 1,
wherein the electronics boards comprise rigid printed circuit boards.

3. The module according to claim 1,
wherein the flexible printed circuit boards between each electronics board comprise flexible printed circuit cables.

4. The module according to claim 1,
wherein the module further comprises communication links on the flexible printed circuit boards between electronics boards for communicating data collected on each electronics board to a controller.

5. The module according to claim 1,
wherein the ground plane of the flexible printed circuit board comprises at least one ground layer for shielding communication links and for providing the ground for the electronics board, or for extending the ground from each electronics board; and at least one signal layer.

6. The module according to claim 5,
wherein the signal layer comprises one of a pure signal layer, or a mixed ground and signal layer.

7. The module according to claim 1,
wherein the series connected flexible printed circuit boards and electronics boards form a continuous loop around the energy storage modules.

8. The module according to claim 1,
wherein each electronic board of the plurality of electronics boards is discrete from and configured to monitor and/or to control the one or more of the energy storage devices.

9. The module according to claim 8,
wherein neighboring electronics boards of the plurality of electronics boards are each directly connected to a respective intervening flexible printed circuit board of the plurality of flexible printed circuit boards.

* * * * *